(12) United States Patent
Lee

(10) Patent No.: US 9,608,049 B2
(45) Date of Patent: Mar. 28, 2017

(54) ORGANIC LIGHT EMITTING DIODE DISPLAY

(71) Applicant: SAMSUNG DISPLAY CO., LTD., Yongin, Gyeonggi-Do (KR)

(72) Inventor: Jusuck Lee, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 52 days.

(21) Appl. No.: 14/504,098

(22) Filed: Oct. 1, 2014

(65) Prior Publication Data

US 2015/0102324 A1 Apr. 16, 2015

(30) Foreign Application Priority Data

Oct. 15, 2013 (KR) .................. 10-2013-0122868

(51) Int. Cl.
*H01L 51/52* (2006.01)
*H01L 27/32* (2006.01)
*H01L 51/54* (2006.01)
*H01L 51/00* (2006.01)

(52) U.S. Cl.
CPC ...... *H01L 27/3244* (2013.01); *H01L 51/0097* (2013.01); *H01L 51/5256* (2013.01); *H01L 2251/5338* (2013.01); *Y02E 10/549* (2013.01)

(58) Field of Classification Search
CPC ............. H01L 27/3244; H01L 51/0097; H01L 51/5256; H01L 2251/5338; Y02E 10/549
See application file for complete search history.

(56) References Cited

U.S. PATENT DOCUMENTS

| 4,241,129 A | 12/1980 | Marton et al. |
| 2003/0034497 A1 | 2/2003 | Yamazaki et al. |
| 2003/0124392 A1* | 7/2003 | Bright ........................... 428/698 |
| 2010/0224881 A1* | 9/2010 | Park et al. ...................... 257/71 |
| 2011/0062444 A1* | 3/2011 | Park et al. ...................... 257/59 |
| 2011/0151173 A1* | 6/2011 | Ramadas ............ C23C 14/0073 428/76 |
| 2012/0097990 A1* | 4/2012 | Koh et al. ........................ 257/88 |
| 2013/0062659 A1* | 3/2013 | Lee et al. ...................... 257/103 |
| 2013/0168712 A1* | 7/2013 | Jeong et al. .................... 257/98 |
| 2013/0175534 A1* | 7/2013 | Chung et al. ................... 257/66 |

FOREIGN PATENT DOCUMENTS

| JP | 10-275680 | 10/1998 |
| KR | 10-0830334 | 5/2008 |
| KR | 10-2011-0019195 | 2/2011 |
| KR | 10-2012-0078483 | 10/2012 |

* cited by examiner

*Primary Examiner* — Hoang-Quan Ho
(74) *Attorney, Agent, or Firm* — F. Chau & Associates, LLC

(57) ABSTRACT

An organic light emitting diode (OLED) display includes a flexible substrate, a barrier layer disposed on the flexible substrate, and an organic light emitting diode disposed on the barrier layer. The barrier layer includes a plurality of metal layers and a plurality of insulation layers in which the metal layers and the insulation layers are alternatively stacked with each other on the flexible substrate.

14 Claims, 4 Drawing Sheets

ORGANIC LIGHT EMITTING DIODE DISPLAY

CROSS-REFERENCE TO RELATED APPLICATION

This application claims priority under 35 U.S.C. §119 to Korean Patent Application No. 10-2013-0122868 filed on Oct. 15, 2013, the disclosure of which is hereby incorporated by reference herein in its entirety.

TECHNICAL FIELD

The present disclosure relates to an organic light emitting diode (OLED) display. More particularly, the present disclosure relates to a flexible OLED display provided with a plastic substrate.

DISCUSSION OF THE RELATED ART

An organic light emitting diode (OLED) display includes an organic light emitting diode and a pixel circuit in each pixel area on a substrate, and displays an image using light emitted from the organic light emitting diode. As the OLED display is a self-emissive display which does not require a backlight, unlike a liquid crystal display, it is possible to reduce the thickness and the weight thereof.

In addition, the OLED display may have a flexible characteristic when a plastic film is used as the substrate. However, the plastic substrate may have a higher water vapor transmission rate (WVTR) than a glass substrate, and thus a barrier layer is provided between the plastic substrate and the pixel circuit for prevention of water transmission. The barrier layer is formed of a plurality of inorganic layers, and may have a structure, for example, in which $SiO_x$ and $S_iN_x$ are alternately layered.

However, the barrier layer may be increased in thickness when assuring a predetermined level of WVTR, thereby deteriorating flexibility. Thus, when stress such as bending or torsion stress is applied to the barrier layer, cracks may be readily formed in the barrier layer, thereby deteriorating the water permeation prevention function. Further, the cracks formed in the barrier layer may spread to an upper portion where the pixel circuit and the organic light emitting diode are located, thereby causing a product failure.

SUMMARY

Exemplary embodiments of the present invention provide an OLED display that can increase a moisture transmission blocking effect by reducing a water vapor transmission rate of a barrier layer and also suppress generation of cracks while increasing flexibility by reducing the thickness of the barrier layer.

An OLED display according to an exemplary embodiment of the present invention includes: a flexible substrate, a barrier layer disposed on the flexible substrate, and an organic light emitting diode disposed on the barrier layer. The barrier layer includes a plurality of metal layers and a plurality of insulation layers in which the metal layers and the insulation layers are alternatively stacked with each other on the flexible substrate.

The metal layers may include at least one selected from a group consisting of aluminum, molybdenum, titanium, copper, nickel, chromium, tungsten, and tin. Each of the metal layers may have a thickness of about 0.01 μm to about 10 μm. A buffer layer including an inorganic layer may be disposed between the barrier layer and the organic light emitting diode, and the insulation layer may be disposed at the outermost side of the barrier layer that contacts the buffer layer.

The insulation layers may include an organic layer. The organic layer may include at least one selected from a group consisting of polyethylene terephthalate, a polyimide, a polycarbonate, an epoxy, a polyethylene, and a polyacrylate.

Alternatively, the insulation layers may include an inorganic layer. The inorganic layers may include at least one selected from a group consisting of a silicon oxide ($SiO_x$), a silicon nitride ($S_iN_x$), alumina ($Al_2O_3$), indium tin oxide (ITO), titanium oxide ($TiO_2$), and gallium arsenide (GaAs), and may be formed using a plasma enhanced chemical vapor deposition (PECVD) method.

The barrier layer may further include a metal oxide layer formed at one side of one of the metal layers that contacts one of the inorganic layers. The metal oxide layer may be formed using an anodization method, and has a thickness of about 2 μm to about 3 μm.

Alternatively, the inorganic layers may include at least one selected from a group consisting of a silicon oxide ($S_iO_x$), a silicon nitride ($S_iN_x$), alumina ($Al_2O_3$), indium tin oxide (ITO), titanium oxide ($TiO_2$), and gallium arsenide (GaAs), and may be formed using an atomic layering deposition (ALD) method.

In accordance with an exemplary embodiment, an organic light emitting diode (OLED) display is provided. The OLED display includes a flexible substrate, a barrier layer disposed on the flexible substrate, a buffer layer disposed on the barrier layer, a thin film transistor disposed on the buffer layer, a capacitor disposed on the buffer layer, a passivation layer disposed on the thin film transistor and the capacitor, an organic light emitting diode disposed on the passivation layer, in which the organic light emitting diode is electrically connected with the thin film transistor, and a thin film encapsulation layer encapsulating the organic light emitting diode, in which the thin film encapsulation film includes a plurality of organic layers and a plurality of inorganic layers alternately stacked with each other on the organic light emitting diode.

The barrier layer includes a plurality of metal layers and a plurality of insulation layers which are alternatively stacked with each other on the flexible substrate, wherein an uppermost one of the insulation layers contacts the buffer layer and a lowermost one of the insulation layers contacts the flexible substrate.

According to exemplary embodiments of the present invention, the OLED display blocks moisture and oxygen entering from a flexible substrate using a barrier layer so that deterioration of the pixel circuit and the organic light emitting diode can be suppressed, and excellent flexibility and transparency can be assured. In addition, as no cracks are readily generated in the barrier layer even through stress such as bending or torsion stress is applied thereto, deterioration of the pixel circuit and the organic light emitting diode due to the cracks can be suppressed.

BRIEF DESCRIPTION OF THE DRAWINGS

Exemplary embodiments of the present invention can be understood in more detail from the following detailed description taken in conjunction with the accompanying drawings in which.

DETAILED DESCRIPTION OF EXEMPLARY EMBODIMENTS

Exemplary embodiments of the present invention will be described more fully hereinafter with reference to the accompanying drawings, in which exemplary embodiments of the invention are shown. As those of ordinary skill in the art would realize, the described embodiments may be modified in various different ways, all without departing from the spirit or scope of the present invention.

Unless explicitly described to the contrary, the word "comprise" and variations such as "comprises" or "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. Further, in the specification, the term "~ on" means positioning on or below the object portion, but does not essentially mean positioning on the upper side of the object portion based on a gravity direction.

Also, as used herein, the singular forms, "a", "an", and "the" are intended to include plural forms as well, unless the context clearly indicates otherwise.

Figure 1:
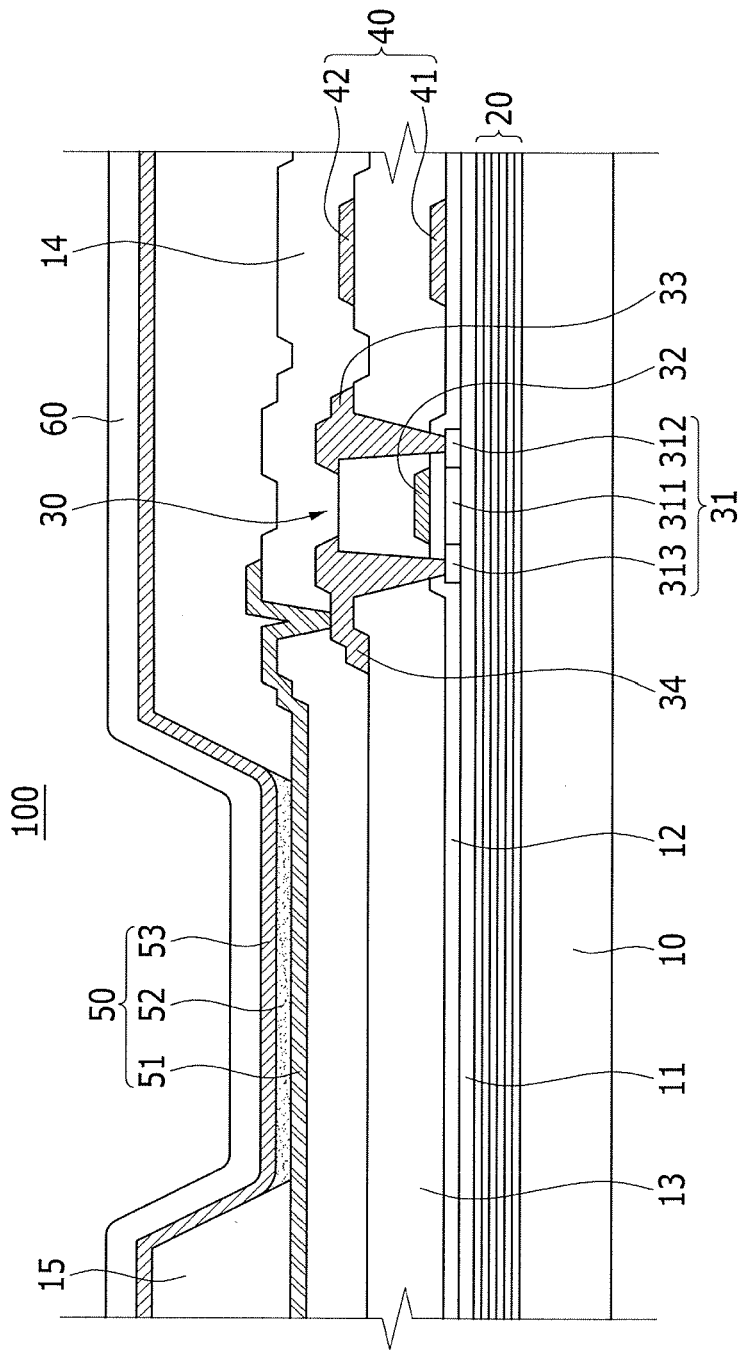
FIG. 1 is a schematic cross-sectional view of an OLED display according to an exemplary embodiment of the present invention.

FIG. 1 is a schematic cross-sectional view of an organic light emitting diode (OLED) display according to an exemplary embodiment of the present invention.

Referring to FIG. 1, an OLED display 100 according to the present exemplary embodiment includes, for example, a flexible substrate 10, a barrier layer 20 formed on the flexible substrate 10, a thin film transistor 30, a capacitor 40, and an organic light emitting diode 50.

The thin film transistor 30 and the capacitor 40 form a pixel circuit, and the pixel circuit and the organic light emitting diode 50 are provided in every pixel area on the flexible substrate 10. The OLED display 100 displays an image using light emitted from the plurality of organic light emitting diodes 50. FIG. 1 illustrates one pixel area for convenience of description.

The flexible substrate 10 is formed of, for example, a plastic film. When the OLED display 100 is a bottom emission-type display and thus light emitted from the organic light emitting diode 50 is discharged through the flexible substrate 10, the flexible substrate 10 is formed of, for example, a transparent plastic film. For example, in an embodiment, the flexible substrate 10 may be formed of, for example, at least one of polycarbonate (PC), polyester (PET), polypropylene (PP), polyethylene (PE) and polymethyl methacrylate (PMMA).

The barrier layer 20 is formed throughout the flexible substrate 10, and has a lower moisture transmission rate and oxygen transmittance than the flexible substrate 10. As the plastic film used as the flexible substrate 10 has a higher moisture transmission rate than a glass substrate, the barrier layer 20 is provided to suppress the permeation of moisture through the flexible substrate 10 and into the pixel circuit and the organic light emitting diode 50.

A buffer layer 11 formed of, for example, an inorganic layer is provided on the barrier layer 20. The buffer layer 11 may include, for example, silicon oxide ($SiO_x$), silicon nitride ($S_iN_x$) and/or silicon oxynitride (SiONx). The buffer layer 11 provides a flat surface for forming the pixel circuit, and prevents permeation of moisture and foreign particles into the pixel circuit and the organic light emitting diode 50.

The thin film transistor 30 and the capacitor 40 are formed on the buffer layer 11. The thin film transistor 30 includes, for example, a semiconductor layer 31, a gate electrode 32, a source electrode 33, and a drain electrode 34. For example, the semiconductor layer 31 is formed of a polysilicon or oxide semiconductor, and includes a channel area 311 in which an impurity is not doped and a source area 312 and a drain area 313 formed at opposite ends of the channel area 311 and doped with an impurity. When the semiconductor layer 31 is formed of the oxide semiconductor, an additional protection layer may be added to protect the oxide semiconductor.

A gate insulating layer 12 is provided between the semiconductor layer 31 and the gate electrode 32, and an interlayer insulating layer 13 is provided between the gate electrode 32 and the source and drain electrodes 33 and 34. The gate insulating layer 12 may include, for example, at least one of silicon nitride (SiNx), silicon oxide (SiOx), silicon oxynitride (SiONx), aluminum oxide ($Al_2O_3$), zirconium oxide ($ZrO_2$), hafnium oxide ($HfO_2$), titanium oxide ($TiO_2$), tantalum oxide ($Ta_2O_5$), a barium-strontium-titanium-oxygen (Ba—Sr—Ti—O) compound, a bismuth-zinc-niobium-oxygen (Bi—Zn—Nb—O) compound, an organic insulating material (e.g. benzocyclobutene (BCB)), and the like.

In an embodiment, the gate electrode 32 may include, for example, at least one of an aluminum-based metal, such as aluminum (Al) or an aluminum alloy, a silver-based metal, such as silver (Ag) or a silver alloy, a copper-based metal, such as copper (Cu) or a copper alloy including copper manganese (CuMn), a molybdenum-based metal, such as molybdenum (Mo) or a molybdenum alloy, chromium (Cr), tantalum (Ta), tungsten (W) and titanium (Ti).

In an embodiment, the source electrode 33 and the drain electrode 34 may each include, for example, at least one of an aluminum-based metal, such as aluminum (Al) or an aluminum alloy, a silver-based metal, such as silver (Ag) or a silver alloy, a copper-based metal, such as copper (Cu) or a copper alloy including copper manganese (CuMn), a molybdenum-based metal, such as molybdenum (Mo) or a molybdenum alloy, chromium (Cr), tantalum (Ta), tungsten (W) and titanium (Ti).

The capacitor 40 includes, for example, a first capacitor plate 41 formed on the gate insulating layer 12 and a second capacitor plate 42 formed on the interlayer insulating layer 13. The first capacitor plate 41 may be made of, for example, the same material as the gate electrode 32, and the second capacitor plate 42 may be made of the same material as the source and drain electrodes 33 and 34. The second capacitor plate 42 may be connected with the source electrode 33.

The thin film transistor 30 shown in FIG. 1 is a driving thin film transistor, and the pixel circuit further includes a switching thin film transistor. The switching thin film transistor is used as a switching element that selects a pixel for light emission, and the driving thin film transistor applies power for light emission of the selected pixel to the corresponding pixel.

A passivation layer 14 is provided on the source and drain electrodes 33 and 34 and the second capacitor plate 42. The passivation layer 14 may be formed of an organic insulating material, an inorganic insulating material, or a compound of the organic insulating material and the inorganic insulating material. For example, in an embodiment, the passivation layer 14 may be formed of, for example, an inorganic insulator such as silicon oxide (SiOx), silicon nitride (SiNx), silicon oxynitride (SiONx), or any combination thereof. The passivation layer 14 has a via hole that partially exposes the drain electrode 34, and the organic light emitting diode 50 is formed on the passivation layer 14.

The organic light emitting diode 50 includes, for example, a pixel electrode 51, an organic emission layer 52, and a common electrode 53. The pixel electrode 51 is provided in each pixel, and is electrically connected with the drain electrode 34 of the thin film transistor 30 through the via hole. The common electrode 53 is formed throughout the flexible substrate 10 without distinction of the pixel. A pixel defining layer 15 partitioning the pixel areas is provided on the pixel electrode 51, and the organic emission layer 52 is formed in an opening of the pixel defining layer 15 and thus contacts the pixel electrode 51.

One of the pixel electrode 51 and the common electrode 53 is an anode, which is a hole injection electrode, and the other is a cathode, which is an electron injection electrode. Holes injected from the anode and electrons injected from the cathode are combined in the organic emission layer 52 to generate excitons, and light emission is performed while the excitons discharge energy.

At least one layer of the hole injection layer and a hole transport layer may be provided between the anode and the organic emission layer 52, and at least one of the electron injection layer and an electron transport layer may be provided between the organic emission layer 52 and the cathode. The hole injection layer, the hole transport layer, the electron transport layer, and the electron injection layer may be formed on the entire flexible substrate 10 without distinction of the pixel.

One of the pixel electrode 51 and the common electrode 53 may be formed of a reflective layer, and the other may be formed of a semi-transmissive or transparent conductive layer. Light emitted from the organic emission layer 52 is reflected by the reflective layer and emitted to the outside through the transparent conductive layer. For example, when the OLED display is a front emission type of display, the pixel electrode 51 is formed of a reflective layer, and when the OLED display is a bottom emission type of display, the common electrode 53 is formed of a reflective layer.

A thin film encapsulation layer 60 is provided on the organic light emitting diode 50. The thin film encapsulation layer 60 encapsulates the organic light emitting diode 50 from the external environment containing moisture and oxygen to suppress deterioration in the organic light emitting diode 50 due to the moisture and oxygen. The thin film encapsulation layer 60 may be formed of, for example, a configuration in which a plurality of organic layers and a plurality of inorganic layers are alternately stacked one by one.

The organic layer of the thin film encapsulation layer 60 is formed of a polymer, and may be a single layer or a stacked layer formed of any one of, for example, polyethylene terephthalate, a polyimide, a polycarbonate, an epoxy, a polyethylene, and a polyacrylate. The inorganic layer of the thin film encapsulation layer 60 may be a single layer or a stacked layer containing, for example, a metal oxide or a metal nitride. For example, the inorganic layer may contain at least one of silicon nitride (SiNx), aluminum oxide ($Al_2O_3$), silicon oxide ($SiO_x$), and titanium oxide ($TiO_2$).

Figure 2:
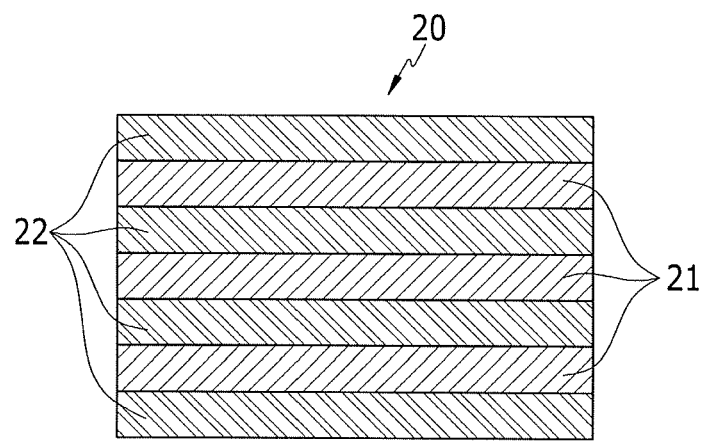
FIG. 2 is an enlarged view of a barrier layer in the OLED display of FIG. 1.

FIG. 2 is an enlarged view of the barrier layer 20 of the OLED display of FIG. 1.

Referring to FIG. 1 and FIG. 2, the OLED display 100 prevents rear-side water vapor transmission by arranging the barrier layer 20 at a rear side of the pixel circuit and the organic light emitting diode 50, and prevents front-side water vapor transmission by arranging the thin film encapsulation layer 60 at a front side of the pixel circuit and the organic light emitting diode 50. In this case, the barrier layer 20 includes a metal layer 21 having a low water vapor transmission rate and a low oxygen transmission rate (OTR).

For example, the barrier layer 20 is formed of a configuration in which a plurality of metal layers 21 and a plurality of insulation layers are alternately layered one by one, and in this case, the insulation layer is formed of an organic layer 22.

For example, the metal layer 21 may be a single layer or a stacked layer formed of at least one of aluminum, molybdenum, titanium, copper, nickel, chromium, tungsten, and tin, and may be formed using a method such as sputtering or thermal evaporation. The organic layer 22 may be a single layer or a stacked layer of a polymer, and may be formed using a method such as, for example, spin coating. The polymer of the organic layer 22 may include, for example, at least one of polyethylene terephthalate, a polyimide, a polycarbonate, an epoxy, a polyethylene, and a polyacrylate.

The metal layer 21 may have a thickness of, for example, about 0.01 μm to about 10 μm. When the thickness of the metal layer 21 is less than about 0.01 μm, the moisture and oxygen blocking performance is deteriorated, and when the thickness of the metal layer 21 exceeds about 10 μm, flexibility and transparency are decreased, thereby causing deterioration of a flexible characteristic and a display characteristic of the OLED display 100. That is, the metal layer 21 having a thickness of about 0.01 μm to about 10 μm can assure an appropriate degree of flexibility and transparency while suppressing moisture and oxygen transmission.

The metal layer 21 is formed by layering a plurality of metal layers 21, interposing the organic layer 22 therebetween so that the water vapor transmission rate and the oxygen transmission rate of the entire barrier layer 20 can be reduced without deterioration of flexibility and transparency. The organic layer 22 is provided between the metal layers 21 to supplement the moisture and oxygen blocking function of the barrier layer 20. The plurality of metal layers 21 are respectively made of, for example, the same material and have the same thickness as each other. In addition, the plurality of organic layers 22 may also be made of, for example, the same material and may have the same thickness as each other.

The organic layers 22 may be provided at the outermost side of the barrier layer 20 that contacts the buffer layer 11. The buffer layer 11 is made of, for example, an inorganic material using a plasma enhanced chemical vapor deposition (PECVD) method because an arc may be formed when an inorganic material is deposited on the metal layer 21 using the PECVD method. Thus, the organic layers 22 is provided at the outermost side of the barrier layer 20 such that the buffer layer 11 is formed without causing the generation of the arc.

Meanwhile, in FIG. 2, the organic layers 22 are provided at the outermost side of the barrier layer 20 that contacts the flexible substrate 10, but the metal layers 21 may be provided at the outermost side of the barrier layer 20 that contacts the flexible substrate 10.

As described, as the barrier layer 20 is provided with the metal layer 21 having the low water vapor transmission rate and oxygen transmission rate, moisture and oxygen entering from the flexible substrate 10 can be effectively blocked. That is, the metal layers 21 perform a barrier function that substantially blocks moisture and oxygen in the barrier layer 20. In addition, the barrier layer 20 supplements the moisture and oxygen blocking function by the organic layers 22 being arranged between the metal layers 21, while the flexibility and the transparency are assured by forming the metal layer 21 as a thin film.

Figure 3:
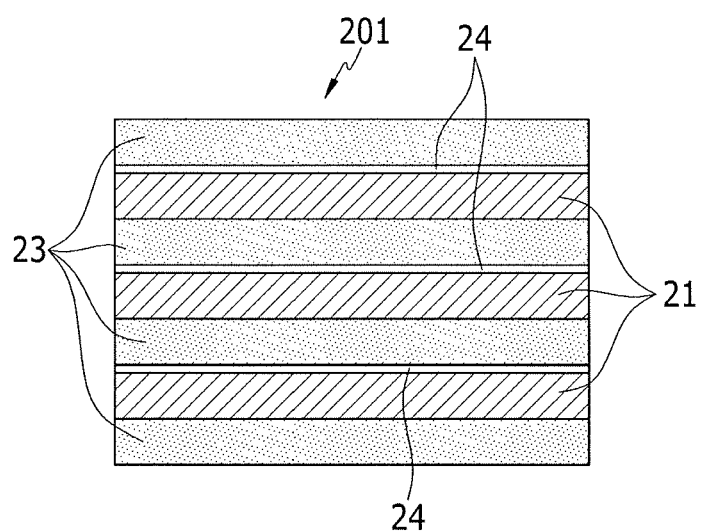
FIG. 3 is an enlarged cross-sectional view of a barrier layer in an OLED display according to an exemplary embodiment of the present invention.

FIG. 3 is an enlarged cross-sectional view of a barrier layer of an OLED display according to an exemplary embodiment of the present invention.

Referring to FIG. 3, an OLED display according to the present exemplary embodiment is the same as the OLED display of FIG. 1, except that an organic layer of a barrier layer 201 is replaced with an inorganic layer 23 and a metal oxide layer 24 is additionally provided. The same reference numerals are used in the present exemplary embodiment to refer to the same components as those of the OLED display of FIG. 1.

The barrier layer 201 is formed of, for example, a configuration in which a plurality of metal layers 21 and a plurality of inorganic layers 23 are alternatively layered one by one. In addition, the inorganic layers 23 are provided at the outermost side of the barrier layer 201 that contacts the flexible substrate 10 and the buffer layer 11. For example, the inorganic layers 23 may be a single layer or a stacked layer including a metal oxide or a metal nitride, and may include any one of a silicon oxide ($S_iO_x$), a silicon nitride ($S_iN_x$), alumina ($Al_2O_3$), indium tin oxide (ITO), titanium oxide ($TiO_2$), and gallium arsenide (GaAs).

As the inorganic layers 23 have a heat-resistive temperature that is significantly higher than that of the organic layer 22, there may be no limit in a process temperature in a subsequent process (e.g., a process for forming a pixel circuit and an organic light emitting diode 50). That is, the organic layer has a heat-resistive temperature of about 450° C., and therefore a temperature in a subsequent process may not exceed about 450° C. However, there is no temperature limitation in the subsequent process in the present exemplary embodiment because the inorganic layers 23 are provided between the plurality of metal layers 21.

The inorganic layers 23 may be formed using, for example, a PECVD method. In this case, an arc may be generated in a process for deposition of the inorganic layer on the metal layer 21, and therefore the metal oxide layer 24 is provided at an upper surface of the metal layer 21 that contacts the inorganic layer 23 to suppress generation of an arc.

That is, in the present exemplary embodiment, the barrier layer 201 is formed with a structure formed by, for example, layering an inorganic layer 23/a metal layer 21/a metal oxide layer 24/an inorganic layer 23/a metal layer 21/a metal oxide layer 24/an inorganic layer 23/a metal layer 21/a metal oxide layer 24/an inorganic layer 23. For example, the metal oxide layer 24 may be formed by a known anodization method, and the metal oxide layer 24 may be formed with a thickness of about 2 μm to about 3 μm at a surface of the metal layer 21.

When the thickness of the metal oxide layer 24 is less than about 2 μm, an arc may be generated in a process for deposition of the inorganic layer 23, and when the thickness of the metal oxide layer 24 exceeds about 3 μm, the metal layer 21 may not be able to function as a moisture transmission blocking layer.

For example, the plurality of metal layers 21 are respectively formed of the same material and have the same thickness as each other. In addition, the plurality of inorganic layers 23 are respectively formed of, for example, the same material and have the same thickness as each other.

Figure 4:
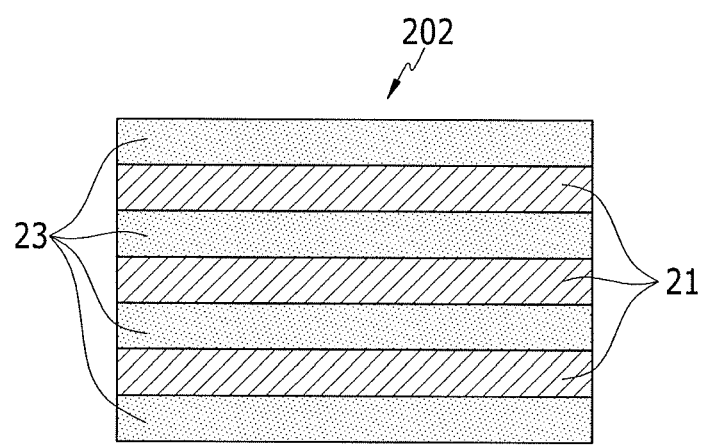
FIG. 4 is an enlarged cross-sectional view of a barrier layer in an OLED display according to an exemplary embodiment of the present invention.

FIG. 4 is an enlarged cross-sectional view of a barrier layer of an OLED display according to an exemplary embodiment of the present invention.

Referring to FIG. 4, an OLED display according to the present exemplary embodiment is the same as the OLED display of FIG. 3, except that a metal oxide layer of a barrier layer 202 is omitted and an inorganic layer 23 is formed using an atomic layer deposition (ALC) method. The same reference numerals are used in the present exemplary embodiment to refer to the same components as those of the OLED display of FIG. 3.

The ALD method is a method for layering atomic layers one by one by alternately supplying an element that is required for forming a membrane. When the ALD method is used, a defect-free and flawless inorganic layer 23 having no impurity can be formed, and a large-sized inorganic layer 23 can be deposited with uniform speed. In addition, when the inorganic layer 23 is deposited on the metal layer 21 using the ALD method, no arc is generated and therefore the metal oxide layer 24 of the barrier layer 201 of the OLED display of FIG. 3 can be omitted.

The barrier layers 20, 201, and 202 of the OLED displays of FIG. 1, FIG. 3 and FIG. 4, respectively are strong against stress compared to a conventional barrier layer formed of a plurality of inorganic layers. Thus, when stress such as bending or torsion stress is applied, cracks may not be readily generated and therefore deterioration of the pixel circuit and the organic light emitting diode 50 due to the cracks can be suppressed.

Further, in the barrier layers 20, 201, and 202 of the OLED displays of FIG. 1, FIG. 3 and FIG. 4, respectively, the metal layer 21 substantially performs a barrier function and therefore the thickness of the organic layer 22 or the inorganic layer 23 included in the barrier layers 20, 201, and 202 can be minimized, and accordingly, the flexibility of the barrier layers 20, 201, and 202 can be excellent compared to a conventional barrier layer.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An organic light emitting diode (OLED) display comprising:
   a flexible substrate;
   a barrier layer disposed on the flexible substrate; and
   an organic light emitting diode disposed on the barrier layer,
   wherein the barrier layer includes a plurality of metal layers, including at least a first and second metal layer, and a plurality of insulation layers, including at least a first and second insulation layer, wherein the first insulation layer is disposed directly on the flexible substrate, the first metal layer is disposed directly on the first insulation layer, a first metal oxide layer is disposed directly on the first metal layer, the second insulation layer is disposed directly on the first metal oxide layer, the second metal layer is disposed directly on the second insulation layer, and a second metal oxide layer is disposed directly on the second metal layer, and wherein the first metal oxide layer and the second metal oxide layer each have a thickness of about 2 µm to about 3 µm.

2. The OLED display of claim 1, wherein the metal layers comprise at least one selected from a group consisting of aluminum, molybdenum, titanium, copper, nickel, chromium, tungsten, and tin.

3. The OLED display of claim 2, wherein each of the metal layers have a thickness of about 0.01 µm to about 10 µm.

4. The OLED display of claim 1, further comprising a buffer layer comprising an inorganic layer disposed between the barrier layer and the organic light emitting diode, and wherein one of the insulation layers is disposed at an outermost side of the barrier layer that contacts the buffer layer.

5. The OLED display of claim 1, wherein the insulation layers comprise an organic layer.

6. The OLED display of claim 5, wherein the organic layers comprise at least one selected from a group consisting of polyethylene terephthalate, a polyimide, a polycarbonate, an epoxy, a polyethylene, and a polyacrylate.

7. The OLED display of claim 1, wherein the insulation layers comprise an inorganic layer.

8. The OLED display of claim 7, wherein the inorganic layers comprise at least one selected from a group consisting of a silicon oxide ($SiO_x$), a silicon nitride ($SiN_x$), alumina ($Al_2O_3$), indium tin oxide (ITO), titanium oxide ($TiO_2$), and gallium arsenide (GaAs).

9. An organic light emitting diode (OILED) display comprising:
 a flexible substrate;
 a barrier layer disposed on the flexible substrate;
 a buffer layer disposed on the barrier layer;
 a thin film transistor disposed on the buffer layer;
 a capacitor disposed on the buffer layer;
 a passivation layer disposed on the thin film transistor and the capacitor;
 an organic light emitting diode disposed on the passivation layer, wherein the organic light emitting diode is electrically connected with the thin film transistor; and
 a thin film encapsulation layer encapsulating the organic light emitting diode, wherein the thin film encapsulation layer includes a plurality of organic layers and a plurality of inorganic layers alternately stacked with each other on the organic light emitting diode,
 wherein the barrier layer includes a plurality of metal layers, including at least a first and second metal layer, and a plurality of insulation layers, including at least a first, second, and third insulation layer, wherein the first insulation layer is disposed directly on the flexible substrate, the first metal layer is disposed directly on the first insulation layer, a first metal oxide layer is disposed directly on the first metal layer, the second insulation layer is disposed directly on the first metal oxide layer, the second metal layer is disposed directly on the second insulation layer, a second metal oxide layer is disposed directly on the second metal layer, and the third insulation layer is disposed directly on the second metal oxide layer, and wherein an uppermost one of the insulation layers contacts the buffer layer and a lowermost one of the insulation layers contacts the flexible substrate, and
 wherein the first metal oxide layer and the second metal oxide layer each have a thickness of about 2 µm to about 3 µm.

10. The OLED display of claim 9, wherein the organic layers of the thin film encapsulation layer comprise at least one selected from the group consisting of polyethylene terephthalate, a polyimide, a polycarbonate, an epoxy, a polyethylene, and a polyacrylate, and wherein the inorganic layers of the thin film encapsulation layer comprise at least one of a metal oxide and a metal nitride.

11. The OLED display of claim 9, wherein the inorganic layers comprise at least one selected from the group consisting of silicon nitride ($SiN_x$), aluminum oxide ($Al_2O_3$), silicon oxide ($SiO_x$), and titanium oxide ($TiO_2$).

12. The OLED display of claim 9, further comprising a gate insulating layer and an interlayer insulating layer, wherein the thin film transistor includes a semiconductor layer, a gate electrode, a source electrode and a drain electrode, wherein the gate insulating layer is disposed between the semiconductor layer and the gate electrode and wherein the interlayer insulating layer is disposed between the gate electrode and the source electrode and the drain electrode, wherein the capacitor includes a first capacitor plate disposed on the gate insulating layer and a second capacitor plate disposed on the interlayer insulating layer, wherein the first capacitor plate is made of a same material as the gate electrode, wherein the second capacitor plate is made of a same material as the source and drain electrodes, and wherein the second capacitor plate is connected to the source electrode.

13. The OLED display of claim 12, wherein the passivation layer includes a via hole therein that partially exposes the drain electrode, wherein the organic light emitting diode includes a pixel electrode disposed on the passivation layer, an organic emission layer disposed on the pixel electrode, and a common electrode disposed on the organic emission layer, and wherein the pixel electrode is electrically connected with the drain electrode through the via hole in the passivation layer.

14. The OLED display of claim 13, further comprising a pixel defining layer disposed on the pixel electrode, and wherein the organic emission layer is disposed in an opening of the pixel defining layer and contacts the pixel electrode.

* * * * *